(12) United States Patent
Kim et al.

(10) Patent No.: US 8,022,480 B2
(45) Date of Patent: Sep. 20, 2011

(54) SEMICONDUCTOR DEVICE AND METHOD FOR MANUFACTURING THE SAME

(75) Inventors: San Hong Kim, Bucheon-si (KR); Jong Min Kim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 125 days.

(21) Appl. No.: 12/572,233

(22) Filed: Oct. 1, 2009

(65) Prior Publication Data
US 2010/0109083 A1    May 6, 2010

(30) Foreign Application Priority Data

Nov. 3, 2008  (KR) .................. 10-2008-0108304

(51) Int. Cl.
*H01L 29/76*  (2006.01)
*H01L 29/94*  (2006.01)
*H01L 31/062* (2006.01)
*H01L 31/113* (2006.01)
*H01L 31/119* (2006.01)

(52) U.S. Cl. .................. 257/372; 257/339; 257/409

(58) Field of Classification Search .......... 257/372, 257/339, 409
See application file for complete search history.

(56) References Cited

U.S. PATENT DOCUMENTS
6,353,247 B1 *  3/2002  Pan ............................... 257/355
2006/0017114 A1 *  1/2006  Chen et al. ..................... 257/371

FOREIGN PATENT DOCUMENTS
KR    10-2007-0071069 A    7/2007

OTHER PUBLICATIONS

Korean Office Action dated Oct. 13, 2010; Korean Patent Application No. 10-2008-0108304; Korean Intellectual Property Office, Republic of Korea.
Deok Ki Jang and Beyong Ha Lee; "High-Voltage LDMOSFET Including a Count Drift Region to Prevent a Threshold Voltage From Becoming Too High in a Long Channel"; Korean Patent Abstracts; Publication No. 10-2007-0071069; Publication Date: Jul. 4, 2007; Korean Intellectual Property Office, Republic of Korea.

* cited by examiner

*Primary Examiner* — Thien F Tran
(74) *Attorney, Agent, or Firm* — The Law Offices of Andrew D. Fortney; Andrew D. Fortney; Sharon E. Brown Turner

(57) ABSTRACT

Disclosed are a semiconductor device and a method for manufacturing the same. The semiconductor device includes at least two of first and second conductive-type high-voltage transistors and first and second conductive-type low-voltage transistors. The first conductive-type high-voltage transistor include a first conductive-type well in a semiconductor substrate, a device isolation film in the first conductive-type well, a gate pattern on the first conductive-type well, second conductive-type drift regions in the semiconductor substrate at opposite sides of the gate pattern, second conductive-type source and drain regions in the second conductive-type drift region, a pick-up region to receive a bias voltage, and a first latch-up inhibiting region under the pick-up region. Accordingly, it is possible to reduce and prevent latchup without using a double guard ring and to eliminate an additional process to form first and second latch-up inhibiting regions.

11 Claims, 4 Drawing Sheets

SEMICONDUCTOR DEVICE AND METHOD FOR MANUFACTURING THE SAME

This application claims the benefit of Korean Patent Application No. 10-2008-0108304, filed on Nov. 3, 2008, which is hereby incorporated by reference as if fully set forth herein.

BACKGROUND OF THE INVENTION

1. Field of the Invention

The present invention relates to a semiconductor device and a method for manufacturing the same. More specifically, the present invention relates to semiconductor devices in an integrated circuit (IC) comprising high- and low-voltage transistors and a method for manufacturing such semiconductor devices.

2. Discussion of the Related Art

Source driver integrated circuits (ICs) are useful as display driver integrated circuits. Such source driver ICs vary slightly in power supply voltage regions, depending on the application(s) of the IC. Notebook computers have a low-voltage operational region of about 3.3V and a high-voltage operational region of about 13.5V. LCD TVs have a low-voltage operational region of about 3.3V and a high-voltage operational region of about 20V. For the purpose of meeting such operational requirements, display driver integrated circuits generally comprise at least two of p- and n-type high-voltage transistors and p-type and n-type low-voltage transistors (e.g., one p-type or n-type high-voltage transistor and one p-type or n-type low-voltage transistor).

Hereinafter, related semiconductor devices to prevent and reduce latchup in such integrated circuits will be described with reference to the annexed drawings.

FIG. 1 is a schematic view of a general integrated circuit to illustrate latchup, wherein the integrated circuit comprises a P-well 10, an N-well 20, high-concentration n-doped regions (N+) 30 and 40, and high-concentration p-doped regions (P+) 32 and 42.

Referring to FIG. 1, in complementary metal oxide semiconductor (CMOS) transistors utilizing dual P and N wells 10 and 20, a parasitic PNPN-type silicon controlled rectifier (SCR) is formed between power supplies (VDD and VSS). Such a parasitic SCR element may turn on, when semiconductor integrated circuits operate. In addition, once the parasitic SCR turns on, it turns off only if the power supply ceases. For this reason, important reliability problems may occur.

In FIG. 1, the value obtained by multiplying a gain of a parasitic NPN transistor (Qnpn) by a gain of a parasitic PNP transistor (Qpnp) should be at least 1 in order to result in a latchup condition. The PNPN SCR may readily latch up when the p-type well resistance (Rpsub) and the n-type well resistance (Rnwell) increases.

FIG. 2 is a cross-sectional view illustrating a related integrated circuit to prevent latchup, wherein the integrated circuit comprises a substrate 50, n-type wells 60 and 64, p-type wells 62 and 66, device isolation films 70 to 78, high-concentration impurity-doped regions 90 to 98 and gate patterns 80 and 82.

The related integrated circuit shown in FIG. 2 comprises additional guard rings comprising high-concentration impurity-doped regions 93 and 94 to reduce gain elements of parasitic NPN transistor (Qnpn) and parasitic PNP transistor Qpnp. That is, an increase in the distance x shown in FIG. 2 prevents two parasitic transistors (i.e., parasitic NPN and PNP transistors Qnpn and Qpnp) from simultaneously operating. The double guard rings 93 and 94 shown in FIG. 2 are commonly adopted to prevent occurrence of latchup on input/output (I/O) terminals where electrostatic discharge (ESD) protection circuits are present. However, when an inner driver stage or core stage also adopts double guard rings, the chip size of integrated circuits increases. For this reason, it is disadvantageous to apply the guard ring structure to the core stage.

SUMMARY OF THE INVENTION

Accordingly, the present invention is directed to a semiconductor device and a method for manufacturing a semiconductor device that substantially obviate one or more problems due to limitations and disadvantages of the related art.

It is one object of the present invention to provide a semiconductor device and a method for manufacturing the same, capable of preventing latchup of integrated circuits without using a double guard ring.

To achieve these object(s) and other advantages and in accordance with the purpose of the invention, as embodied and broadly described herein, provided is a semiconductor device in an integrated circuit including at least two of first and second conductive-type high-voltage transistors and first and second conductive-type low-voltage transistors, wherein the first conductive-type high-voltage transistor includes a first conductive-type well in a semiconductor substrate; a device isolation film in the first conductive-type well; a gate pattern on the first conductive-type well; second conductive-type drift regions in the semiconductor substrate at opposite sides of the gate pattern; second conductive-type source and drain regions in the second conductive-type drift region; a pick-up region to receive a bias voltage; and a first latch-up inhibiting region under the pick-up region. In one embodiment, the integrated circuit includes a first conductive-type high-voltage transistor, a second conductive-type high-voltage transistor, a first conductive-type low-voltage transistor, and a second conductive-type low-voltage transistor.

In accordance with another aspect of the present invention, provided is a method for manufacturing a semiconductor device in an integrated circuit including at least two of first and second conductive-type high-voltage transistors and first and second conductive-type low-voltage transistors, the method including forming a first conductive-type well in a semiconductor substrate; forming a device isolation film to define an active region in the first conductive-type well; forming second conductive-type drift regions in the first conductive-type well such that the second conductive-type drift regions are spaced from each other by a predetermined distance; forming a first conductive-type first latch-up inhibiting region in a tap region; forming a gate pattern between the second conductive-type drift regions; and implanting ions into the second conductive-type drift regions to form second conductive-type drain and source regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle(s) of the invention. In the drawings.

DETAILED DESCRIPTION OF THE INVENTION

Hereinafter, although the present invention is described under the assumption that a first conductive-type mentioned in claims is a p-type and a second conductive-type is an n-type, the present invention is not limited thereto. That is, the present invention may be applied in the same manner under the assumption that the first conductive-type is an n-type and the second conductive-type is a p-type. In addition, even though the semiconductor device is described below as a p- or n-type high-voltage transistor, the present invention is not limited thereto. Furthermore, the semiconductor device may be included in an integrated circuit comprising at least one of the p- and n-type low-voltage transistors (and in a further embodiment, both of the p-type low-voltage transistor and the n-type low-voltage transistor).

Hereinafter, the semiconductor device will be described with conjunction to the accompanying drawings according to an exemplary embodiment of the present invention. For a better understanding, the present invention is described under the assumption that the semiconductor device is a drain extended metal oxide semiconductor (MOS) transistor, but it is not limited thereto. That is, the present invention may be applied to various high-voltage transistors.

Figure 1:
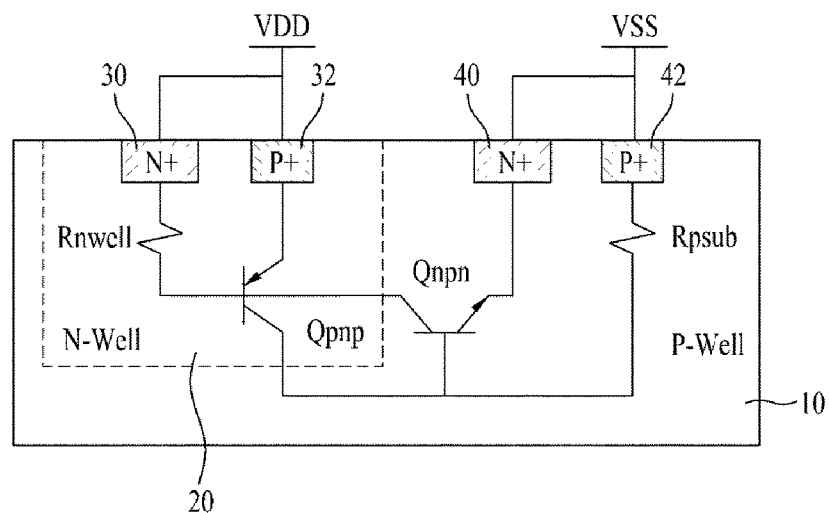
FIG. 1 is a schematic view of a general integrated circuit to illustrate latchup.
Figure 2:
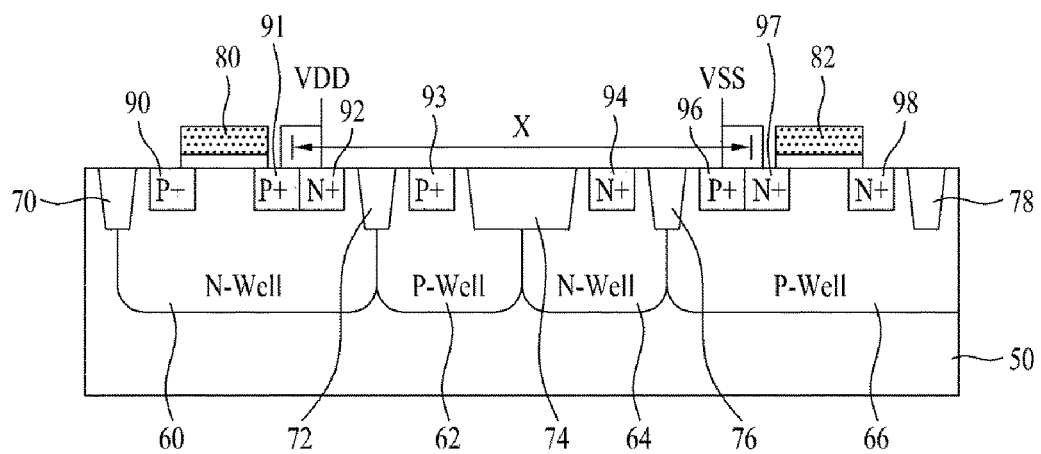
FIG. 2 is a cross-sectional view illustrating a related integrated circuit to prevent latchup.
Figure 3:
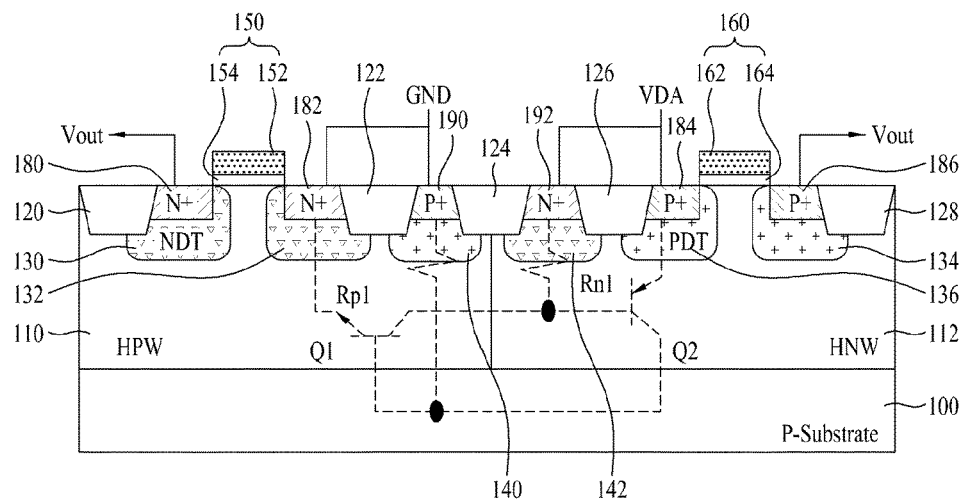
FIG. 3 is a cross-sectional view illustrating a semiconductor device according to one embodiment of the present invention.

FIG. 3 is a cross-sectional view illustrating a semiconductor device according to one embodiment of the present invention.

The semiconductor device shown in FIG. 3 includes a high-voltage (HV) NMOS transistor and a HV PMOS transistor.

Referring to FIG. 3, a p-type well (HPW) 110 and an n-type well (HNW) 112 are formed on a p-type semiconductor substrate (P-substrate) 100. Device isolation films 120 to 128 formed in the respective wells 110 and 112 (including isolation film 124 at the interface between wells 110 and 112) define one or more active regions and one or more non-active (e.g., field) regions therein.

A gate pattern 150 is formed on the HPW 110. The gate pattern 150 comprises a gate insulating pattern 154 and a gate electrode 152. Similarly, a gate pattern 160 is formed on the HNW 112. The gate pattern 160 comprises a gate insulating pattern 164 and a gate electrode 162, substantially identical to gate pattern 150, gate insulating pattern 154 and gate electrode 152 (except for any dopant that may be in the gate electrodes 152 and 162, which generally is of the opposite conductivity type from the corresponding well 110 or 120). A spacer (not shown in FIG. 3) may be formed at sidewalls of the gate patterns 150 and 160.

In the HV NMOS transistor, n-type drift regions (NDT) 130 and 132 are spaced from each other in the HPW 110 at opposite sides of the gate pattern 150. In the HV PMOS transistor, p-type drift regions (PDT) 134 and 136 are spaced from each other in the HNW 112 at opposite sides of the gate pattern 160. The NDTs 130 and 132 and the PDTs 134 and 136 shown in FIG. 3 contact the gate patterns 150 and 160, respectively. Alternatively, the NDTs 130 and 132 and the PDTs 134 and 136 may be spaced from the same.

At this time, in the HV NMOS transistor, high-concentration n-type drain and source regions (N+) 180 and 182 are formed in the NDTs 130 and 132, respectively. In the HV PMOS transistor, high-concentration p-type source and drain regions (P+) 184 and 186 are formed in the PDTs 136 and 134, respectively. Source/drain regions 182 and 184 may extend from about a sidewall of the respective gate electrode 152 and 162 to the nearest isolation region 122 and 126, respectively.

In addition, pick-up regions 190 and 192, to which a bias voltage is applied, are formed in terminals of the respective transistors (e.g., Q1 and Q2). Pick-up regions 190 and 192 may extend across an entire active region, from a central isolation region 124 to a nearest isolation region 122 or 126, respectively. In the case of HV NMOS transistor, a ground voltage (GND) is applied as a bias voltage through the pick-up region 190, and in the case of HV PMOS transistor, a supply voltage (VCC or VDA) is applied as a bias voltage through the pick-up region 192. That is, the pick-up regions 190 and 192 do not have any effect on the operation of the semiconductor device under normal operating conditions.

In accordance with the present invention, in the HV NMOS transistor, a p-type first latch-up inhibiting region 140 is formed under the pick-up region 190, and in the HV PMOS transistor, an n-type first latch-up inhibiting region 142 is formed under the pick-up region 192.

In this case, according to one embodiment of the present invention, the concentration of the first latch-up inhibiting region 140 in the HV NMOS transistor may be equivalent to that of the p-type drift regions (PDTs) 134 and 136 in the HV PMOS transistor. That is, the first latch-up inhibiting region 140 may be formed by the same ion implantation as the PDTs 134 and 136. This is one reason why the first latch-up inhibiting region 140 may be considered to be formed in the HV NMOS transistor, while PDTs 134 and 136 may be considered to be formed in the HV PMOS transistor. Similarly, the concentration of the first latch-up inhibiting region 142 in the HV PMOS transistor may be equivalent to the concentration of the NDTs 130 and 132 in the HV NMOS transistor. That is, the first latch-up inhibiting region 142 may formed by the same ion implantation as the NDTs 130 and 132. This is a reason why the first latch-up inhibiting region 142 may be considered to be formed in the HV PMOS transistor, while the NDTs 130 and 132 may be considered to be formed in the HV NMOS transistor.

According to another embodiment of the present invention, the concentration of the first latch-up inhibiting region 140 in the HV NMOS transistor may be equivalent to the concentration of a p-well (not shown) in a low-voltage (LV) NMOS transistor (not shown). That is, the first latch-up inhibiting region 140 may formed by an ion implantation process used to form the p-well. This is a reason why the first latch-up inhibiting region 140 may be considered to be formed in the HV NMOS transistor, while the p-well may be considered to be formed in the LV NMOS transistor. Similarly, the concentration of the first latch-up inhibiting region 142 in the HV PMOS transistor may be equivalent to that of the n-type well (not shown) in the LV PMOS transistor (not shown). That is, the first latch-up inhibiting region 142 may be formed by an ion implantation process used to form the n-well. This is a reason why the first latch-up inhibiting region 142 of the HV PMOS transistor may be formed simultaneously with the n-type well of the LV PMOS transistor.

The concentration of the p-type first latch-up inhibiting region 140 shown in FIG. 3 may be higher than that of the HPW 110, and the concentration of n-type first latch-up inhibiting region 142 may be higher than that of the HNW 112. In addition, the concentration of p-type pick-up region 190 may be higher than that of the p-type first latch-up inhibiting region 140 and the concentration of n-type pick-up region 192 may be higher than that of the n-type first latch-up inhibiting region 142.

Hereinafter, a semiconductor device, in which the first latch-up inhibiting region 140 is formed by the same ion implantation process used to form the PDT and the second latch-up inhibiting region 142 is formed by the same ion implantation process used to form the NDT, will be described with reference to the accompanying drawings according to another embodiment of the present invention.

Figure 4:
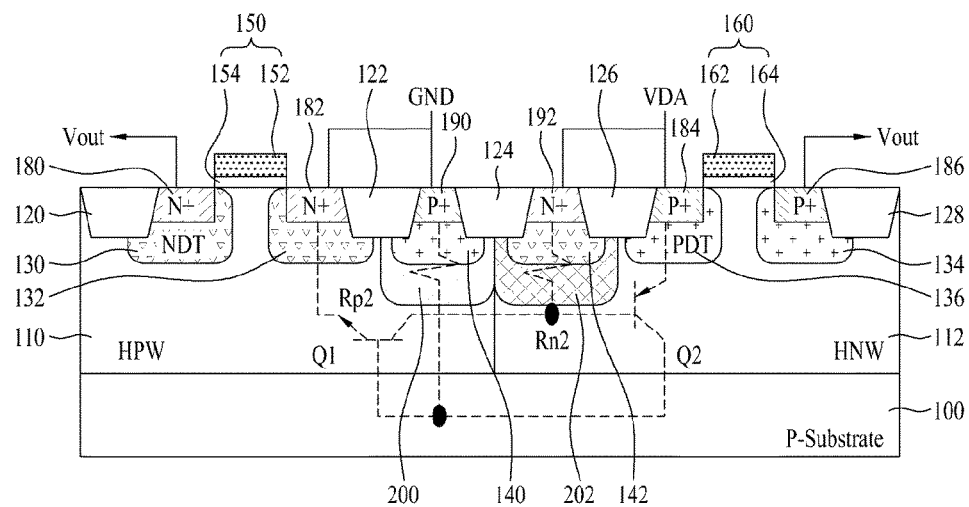
FIG. 4 is a cross-sectional view illustrating a semiconductor device according to another embodiment of the present invention.

FIG. 4 is a cross-sectional view illustrating a semiconductor device according to another embodiment of the present invention.

The semiconductor device in FIG. 4 is the same as that in FIG. 3 except that the semiconductor device further comprises second latch-up inhibiting regions 200 and 202, and identical elements are thus designated by the same reference numerals in FIGS. 3 and 4. Hereinafter, only differences between the semiconductor device shown in FIG. 4 and the semiconductor device shown in FIG. 3 will be described.

Unlike in FIG. 3, the semiconductor device in FIG. further comprises second latch-up inhibiting regions 200 and 202. The p-type second latch-up inhibiting region 200 in the HV NMOS transistor is formed under the first latch-up inhibiting region 140 (e.g., the first latch-up inhibiting region 140 is formed in the p-type second latch-up inhibiting region 200), and the n-type second latch-up inhibiting region 202 in the HV PMOS transistor is formed under the first latch-up inhibiting region 142 (e.g., the first latch-up inhibiting region 142 is formed in the n-type second latch-up inhibiting region 202).

In this case, according to the present invention, the concentration of second latch-up inhibiting region 200 in the HV NMOS transistor may be equivalent to the concentration of the p-type well (not shown) in the LV NMOS transistor. This is a reason why the second latch-up inhibiting region 200 may be formed in the same ion implantation process that forms the HV NMOS transistor, simultaneously while a p-well is formed in the same ion implantation process that forms the LV NMOS transistor. Similarly, the concentration of second latch-up inhibiting region 202 in the HV PMOS transistor may be equivalent to the concentration of n-type well (not shown) in the LV PMOS transistor (not shown). This is a reason why the second latch-up inhibiting region 202 may be formed in the same ion implantation process that forms the HV PMOS transistor, simultaneously while an n-type well is formed in the same ion implantation process that forms the LV PMOS transistor.

According to the present invention, as shown in FIG. 4, the concentration of p-type second latch-up inhibiting region 200 is higher than the concentration of HPW 110, and the concentration of n-type second latch-up inhibiting region 202 is higher than the concentration of the HNW 112. In addition, the concentration of p-type first latch-up inhibiting region 140 is not less than the concentration of p-type second latch-up inhibiting region 200 (and in some embodiments, higher than that of p-type second latch-up inhibiting region 200), and the concentration of n-type first latch-up inhibiting region 142 is not less than the concentration of n-type second latch-up inhibiting region 202 (and in some embodiments, higher than that of n-type second latch-up inhibiting region 202).

In addition, one or more interlayer dielectric films (not shown), contact holes (not shown) and contact plugs (not shown) may be further formed on the semiconductor devices shown in FIGS. 3 and 4. This is well-known in the art and a detailed explanation thereof is thus omitted.

In the case where the aforementioned semiconductor device of the present invention does not include first and second latch-up inhibiting regions 140, 142, 200 and 202, the following problems may occur.

The NDTs 130 and 132 and HPW 110 inevitably have a low concentration in the HV NMOS transistor, to resist a high voltage. Similarly, the PDTs 134 and 136 and HNW 112 inevitably have a low concentration in the HV PMOS transistor. Accordingly, resistances Rp1 and Rp2 in HPW 110 are present between emitters and bases of the parasitic bipolar transistor Q1. In addition, resistances Rn1 and Rn2 in the HNW 112 are present between emitters and bases of the parasitic bipolar transistor Q2. Accordingly, in the case of parasitic bipolar transistors, when the electric potential difference (Vbe) between the base and the emitter is 0.7 V or higher, the parasitic NPN transistor Q1 enters into a normal operation mode. Accordingly, HV processes utilizing low concentrations inevitably entail higher resistances Rp1, Rp2, Rn1 and Rn2. Thus, even though a low electric current is applied, parasitic bipolar transistors Q1 and Q2 can readily operate, thus disadvantageously causing latch-up of integrated circuits.

However, in the semiconductor devices and/or integrated circuits according to the present invention, the first latch-up inhibiting regions 140 and 142 under the pick-up regions 190 and 192 have a concentration higher than those of the HPW 110 and the HNW 112, as shown in FIG. 3. Accordingly, latch-up characteristics can be improved by reducing the resistances Rp1 and Rn1. In particular, the semiconductor device shown in FIG. 4 further comprises second latch-up inhibiting regions 200 and 202, thus further reducing resistances Rp2 and Rn2, and improving latch-up characteristics even more. This leads to an increase in concentration, causing a decrease in breakdown voltage. However, the breakdown voltage between the HPW 110 and the HNW 112 is higher than the breakdown voltage between the NDT 130 or 132 and the HPW 110, as well as the breakdown voltage between the PDT 134 or 136 and the HNW 112, which determines the breakdown voltage of the HV NMOS transistor and the breakdown voltage of the HV PMOS transistor, respectively. Accordingly, although the semiconductor device may further comprise second latch-up inhibiting regions 200 and/or 202, it can exhibit sufficient breakdown voltage margin.

Hereinafter, a method for manufacturing the semiconductor device shown in FIG. 4 will be described with reference to the accompanying drawings according to various embodiments of the present invention.

Figure 5A:
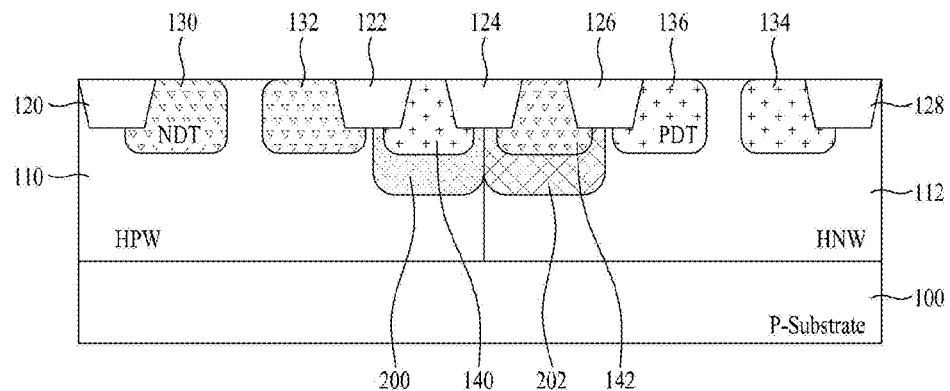
FIGS. 5A to 5C are cross-sectional views illustrating exemplary structures in a method for manufacturing a semiconductor device according to embodiments of the present invention.
Figure 5B:
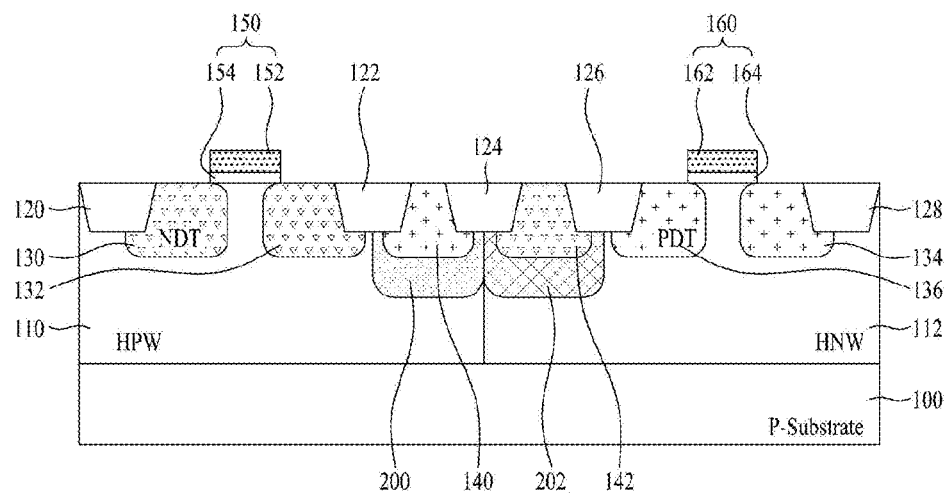
Figure 5C:
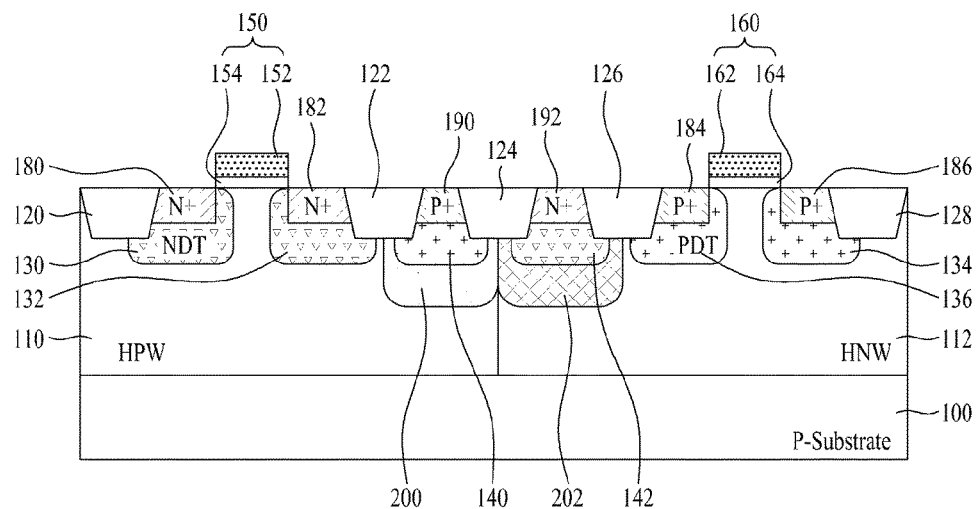

FIGS. 5A to 5C are cross-sectional views illustrating exemplary structures in a method for manufacturing a semiconductor device according to embodiments of the present invention.

Referring to FIG. 5A, an HPW 110 and an HNW 112 are formed on a semiconductor substrate 100. For example, the HPW 110 is formed by coating (or, applying) a photoresist (not shown) on the upper surface of the semiconductor substrate 100, patterning the photoresist by a photolithographic process to open a region where a HV NMOS transistor is formed, and doping or implanting p-type ions into the substrate 100, using the patterned photoresist (not shown) as a mask. Then, the HNW 112 is formed by coating another photoresist (not shown) on the upper surface of the semiconductor substrate 100, patterning the photoresist by a photolithographic process to open a region where a HV PMOS transistor is formed, and doping or implanting n-type ions into the substrate 100 using the patterned photoresist (not shown) as a mask.

Next, device isolation films 120 to 128 are formed in the HPW 110 and the HNW 112, as well as at the interface between the HPW 110 and the HNW 112, to define one or more active regions and one or more non-active (or field) regions. The process for forming the device isolation films 120 to 128 is well-known in the art (e.g., shallow trench isolation, local oxidation of silicon, or a combination of both processes) and a detailed explanation thereof is thus omitted.

Next, a second latch-up inhibiting region 200 is formed in the tap region between the device isolation films 122 and 124, and a second latch-up inhibiting region 202 is formed in the tap region between the device isolation films 124 and 126. As used herein, the term "tap region" refers to a region where pick-up regions 190 and 192 as shown in FIG. 4 are formed.

According to the present invention, the second latch-up inhibiting region 200 may be formed in or adjacent to the HV NMOS transistor simultaneously with a p-well in the LV NMOS transistor. Similarly, the second latch-up inhibiting region 202 may be formed in the HV PMOS transistor simultaneously with an n-type well in the LV PMOS transistor.

Next, NDTs 130 and 132 are formed in the HPW 110 spaced from each other by a predetermined distance, and PDTs 134 and 136 are formed in the HNW 112 spaced from each other by a predetermined distance. The formation process of the NDTs 130 and 132, and PDTs 134 and 136 (e.g., photolithographic patterning of a photoresist and ion implantation) is well-known in the art and a detailed explanation thereof is thus omitted.

At this time, a p-type first latch-up inhibiting region 140 is formed in the second latch-up inhibiting region 200 in the tap region of the HV NMOS transistor. In addition, an n-type first latch-up inhibiting region 142 is formed in the second latch-up inhibiting region 202 in the tap region of the HV PMOS transistor. The first latch-up inhibiting region 140 may be formed in or adjacent to the HV NMOS transistor, simultaneously with (e.g., by the same ion implantation process as) the PDTs 134 and 136 in the HV PMOS transistor. Similarly, the first latch-up inhibiting region 142 may be formed in or adjacent to the HV PMOS transistor, simultaneously with (e.g., by the same ion implantation process as) NDTs 130 and 132 in the HV NMOS transistor.

Hereinafter, as shown in FIG. 5B, a gate pattern 150 is formed between the NDTs 130 and 132 in the HV NMOS transistor. In addition (and generally, simultaneously), a gate pattern 160 is formed between the PDTs 134 and 136 in the HV PMOS transistor. For example, a gate insulating film (not shown) and a polysilicon layer (not shown) or metal layer (not shown) are sequentially deposited or otherwise formed (e.g., the gate insulating film may be formed by wet or dry thermal oxidation) over substantially the entire surface of the semiconductor substrate 100, and then patterned to form gate patterns 150 and 160 comprising the patterned gate insulating films 154 and 164 and the gate electrodes 152 and 162.

Next, as shown in FIG. 5C, a high concentration of impurity ions (e.g., N-type ions) are implanted into the NDTs 130 and 132 at opposite sides of the gate pattern 150 in the HV NMOS transistor to form n-type drain and source regions 180 and 182. In addition, a high concentration of impurity ions (e.g., P-type ions) are implanted to the PDTs 134 and 136 present at opposite sides of the gate pattern 160 in the HV PMOS transistor to form p-type drain and source regions 186 and 184. In the process of implanting the impurity ions, the gate patterns 150 and 160 serve as ion-implantation masks. When a spacer (not shown) is formed at sides of the gate patterns 150 and 160, the gate patterns 150 and 160 and the spacer are used as ion-implantation masks to form source and drain regions 180 to 186.

A pick-up region 190, configured to receive a bias voltage (e.g., a ground potential GND) may be formed in the tap region of the HV NMOS transistor when the source and drain regions 184 and 186 are formed in the HV PMOS transistor. In addition, a pick-up region 192 to receive another bias voltage (e.g., a positive power supply such as VCC or VDA) may be formed in the tap region of the HV PMOS transistor when the drain and source regions 180 and 182 are formed in the HV NMOS transistor.

FIGS. 5A to 5C mentioned above illustrate a method for manufacturing a semiconductor device shown in FIG. 4. The method for manufacturing a semiconductor device shown in FIG. 3 in which the first latch-up inhibiting region 140 is formed by the same ion implantation process that forms the PDTs and the first latch-up inhibiting region 142 is formed by the same ion implantation process that forms the NDTs may be obtained by omitting the process for forming the second latch-up inhibiting regions 200 and 202.

In addition, the semiconductor device comprising the first latch-up inhibiting regions 140 and 142 shown in FIG. 3, in which the first latch-up inhibiting region 140 may be formed by the same ion implantation process that forms a p-well and the first latch-up inhibiting region 142 may be formed by the same ion implantation process that forms an n-well, can be manufactured by omitting a process for forming first latch-up inhibiting regions 140 and 142 shown in FIG. 5A. In this case, the p-type first latch-up inhibiting region 140 is formed in or adjacent to the HV NMOS transistor, sequentially while a p-well is formed in the LV NMOS transistor. In addition, the n-type first latch-up inhibiting region 142 may be formed in or adjacent to the HV PMOS transistor, sequentially while an n-type well is formed in the LV PMOS transistor. That is, regions 200 and 202 shown in FIG. 5A correspond to the first and second latch-up inhibiting regions 140 and 142 shown in FIG. 3, respectively.

The method for manufacturing the semiconductor device of the present invention is not limited to the sequence of processes associated with regions except regions 140, 142, 200 and 202, as long as the pick-up regions 190 and 192 can be formed in at least one of the first and second latch-up inhibiting regions 140, 142, 200 and 202.

Figure 6:
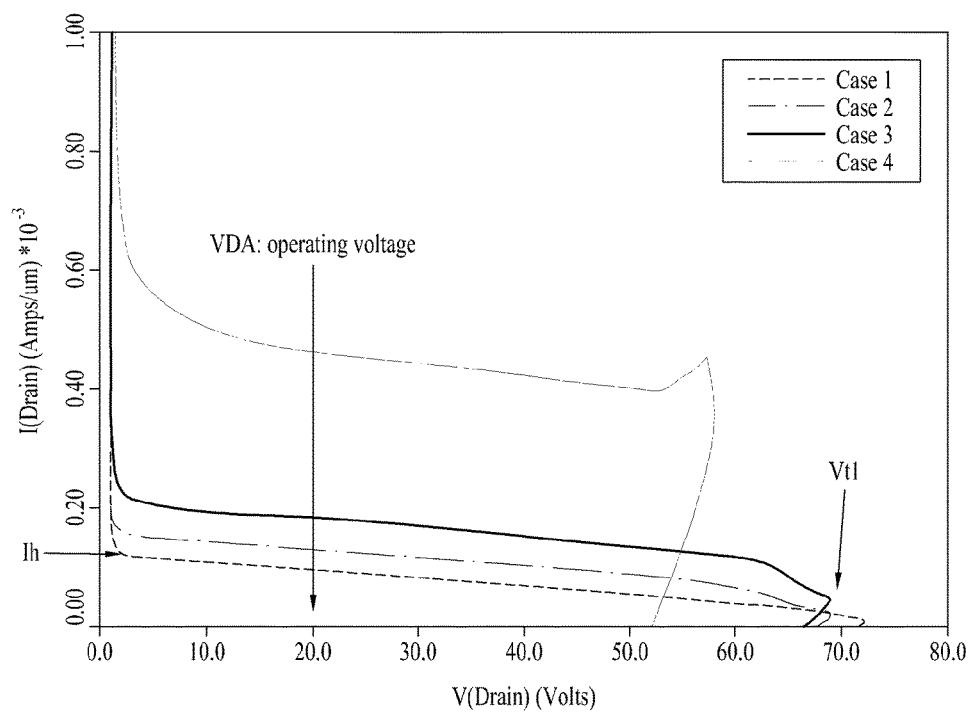
FIG. 6 is a graph showing snapback simulation results to illustrate snapback characteristics of integrated circuitry in accordance with the present invention and comparable integrated circuitry in accordance with the related art.

FIG. 6 is a graph showing simulation results to illustrate snapback characteristics of a circuit made in accordance with the present invention and a circuit made in accordance with the related art. In this graph, a drain voltage is plotted along the horizontal axis, and a drain current is plotted along the vertical axis.

Referring to FIG. 6, Case 1 shows a snapback characteristic in the circuit made in accordance with a related art. In this case, the semiconductor device operates at a trigger voltage (Vt1) higher than an operating voltage (20V). However, Case 1 has a low holding voltage (Vh) and holding current (Ih). Case 1 is inevitably exposed to occurrence of latch-up according to external operations due to the low Ih.

In Case 2, concentrations of HPW and HNW are increased to about 30% under related process conditions. From the graph, Case 2 shows a 25% increase in Ih due to decreased resistances Rp and Rn.

However, Case 3, the semiconductor device shown in FIG. 3 according to the present invention wherein the first latch-up inhibiting region 140 is formed by the same ion implantation process as the PDT and the first latch-up inhibiting region 142 is formed by the same ion implantation process as the NDT, and Case 4, the semiconductor device shown in FIG. 4, exhibit 67% and 273% increases in Ih, respectively, as compared to Cases 1 and 2. In particular, latchup characteristics of chips for televisions (TVs) operating at high temperatures are evaluated at a temperature of about 100° C., and the latchup characteristics of such chips are the same at the high temperature (e.g., 100° C.).

As is apparent from the foregoing, in the semiconductor device and method for manufacturing the same according to the present invention, since at least one (and in one embodiment, both) of the first and second latch-up inhibiting regions is under the pick-up region, the holding current (Ih) of the PNPN SCR structure in integrated circuits (in particular, pre-driver stages of the [LCD driver] integrated circuits) can increase considerably without using a double guard ring, thus improving device performance and preventing latchup in some circumstances. In addition, the first and second latch-up inhibiting regions can be formed simultaneously with NDT and PDT regions and/or with low-voltage transistor wells, thus advantageously eliminating the necessity of an additional process to form the first and second latch-up inhibiting regions.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor device in an integrated circuit comprising at least two of first and second conductive-type high-voltage transistors and first and second conductive-type low-voltage transistors, wherein the first conductive-type high-voltage transistor comprises:
    a first conductive-type well in a semiconductor substrate;
    a device isolation film in the first conductive-type well;
    a gate pattern on the first conductive-type well;
    second conductive-type drift regions in the semiconductor substrate at opposite sides of the gate pattern;
    second conductive-type source and drain regions in the second conductive-type drift regions;
    a pick-up region configured to receive a bias voltage; and
    a first latch-up inhibiting region under the pick-up region.

2. The semiconductor device according to claim 1, further comprising a second latch-up inhibiting region under the first latch-up inhibiting region.

3. The semiconductor device according to claim 2, wherein the first and second latch-up inhibiting regions have the first conductive type.

4. The semiconductor device according to claim 1, wherein the first latch-up inhibiting region has the first conductive type.

5. The semiconductor device according to claim 1, wherein a concentration of the first latch-up inhibiting region is equivalent to a concentration of the second conductive-type drift region of the second conductive-type high-voltage transistor.

6. The semiconductor device according to claim 5, wherein a concentration of the second latch-up inhibiting region is equivalent to a concentration of the second conductive-type well of the first conductive-type low-voltage transistor.

7. The semiconductor device according to claim 6, wherein a concentration of the second latch-up inhibiting region is higher than a concentration of the well.

8. The semiconductor device according to claim 1, wherein a concentration of the first latch-up inhibiting region is equivalent to a concentration of the second conductive-type well of the first conductive-type low-voltage transistor.

9. The semiconductor device according to claim 8, wherein a concentration of the first latch-up inhibiting region is higher than a concentration of the second latch-up inhibiting region.

10. The semiconductor device according to claim 1, wherein a concentration of the first latch-up inhibiting region is higher than a concentration of the well.

11. The semiconductor device according to claim 1, comprising the first conductive-type high-voltage transistor and the second conductive-type high-voltage transistor.

* * * * *